United States Patent
Chen

(10) Patent No.: US 9,252,179 B2
(45) Date of Patent: Feb. 2, 2016

(54) IMAGE SENSOR STRUCTURES

(71) Applicant: VisEra Technologies Company Limited, Hsin-Chu (TW)

(72) Inventor: Chin-Fu Chen, Hsinchu (TW)

(73) Assignee: VisEra Technologies Company Limited, Hsin-Chu (TW)

( * ) Notice: Subject to any disclaimer, the term of this patent is extended or adjusted under 35 U.S.C. 154(b) by 0 days.

(21) Appl. No.: 14/304,622

(22) Filed: Jun. 13, 2014

(65) Prior Publication Data

US 2015/0364516 A1    Dec. 17, 2015

(51) Int. Cl.
| | |
|---|---|
| *H01L 27/16* | (2006.01) |
| *H01L 27/146* | (2006.01) |
| *H01L 23/48* | (2006.01) |
| *H01L 31/0236* | (2006.01) |
| *H01L 21/02* | (2006.01) |

(52) U.S. Cl.
CPC .... *H01L 27/14636* (2013.01); *H01L 21/02225* (2013.01); *H01L 23/481* (2013.01); *H01L 27/14603* (2013.01); *H01L 31/02366* (2013.01)

(58) Field of Classification Search
CPC . H01L 31/02366; H01L 31/18; H01L 31/186; H01L 27/14683; H01L 27/14865; H01L 27/14687; H01L 27/14689; H01L 27/148; H01L 21/02225; H01L 21/02299; H01L 21/31; H01L 21/302
See application file for complete search history.

(56) References Cited

U.S. PATENT DOCUMENTS

| | | | | |
|---|---|---|---|---|
| 5,391,920 | A   * | 2/1995 | Tsuji | 257/758 |
| 5,445,996 | A   * | 8/1995 | Kodera et al. | 438/633 |
| 6,204,184 | B1 * | 3/2001 | Nishida et al. | 438/692 |
| 6,335,561 | B2 * | 1/2002 | Imoto | 257/626 |
| 6,433,438 | B2 * | 8/2002 | Koubuchi et al. | 257/776 |
| 8,828,875 | B1 * | 9/2014 | Lu et al. | 438/690 |
| 2001/0011761 | A1 * | 8/2001 | Imoto | 257/638 |
| 2013/0234734 | A1 * | 9/2013 | Iida et al. | 324/661 |
| 2014/0042640 | A1 * | 2/2014 | Tsai et al. | 257/774 |
| 2014/0246780 | A1 * | 9/2014 | Takada | 257/773 |

* cited by examiner

*Primary Examiner* — Victoria K Hall
(74) *Attorney, Agent, or Firm* — Muncy, Geissler, Olds & Lowe, P.C.

(57) ABSTRACT

An image sensor structure is provided. The image sensor structure includes a substrate including a central area and a peripheral area, a sensing area including a plurality of pixels located at the central area of the substrate, a plurality of bond pads disposed at the peripheral area of the substrate, and an array of protrusions disposed between the bond pads and the sensing area and surrounding the sensing area, wherein a largest distance between any two points of the protrusion under a top view is getting smaller from the peripheral area to the central area.

18 Claims, 4 Drawing Sheets

IMAGE SENSOR STRUCTURES

BACKGROUND OF THE INVENTION

1. Field of the Invention

The invention relates to an image sensor structure, and more particularly to an image sensor structure with an array of protrusions disposed between bond pads and a sensing area.

2. Description of the Related Art

An image sensor, as a kind of semiconductor device, transforms optical images into electrical signals. Image sensors can be generally classified into charge coupled devices (CCDs) and complementary metal oxide semiconductor (CMOS) image sensors. Among these image sensors, a CMOS image sensor comprises a photodiode for detecting incident light and transforming it into electrical signals, and logic circuits for transmitting and processing the electrical signals.

In the process for fabricating an image sensor, multiple photoresist coating processes in various stages are required. However, non-uniform photoresist coating generally occurs due to an uneven wafer surface having trenches with various depths for subsequently forming, for example, bond pads and scribe lines, resulting in the formation of striation defects on the wafer, deteriorating the display picture quality.

Currently, a technique of filling photoresist material into the trenches with various depths to even the wafer surface before the above-mentioned photoresist coating process has been adopted to reduce striation defects. However, in order to fill the trenches with various depths, multiple masks are required, thus increasing cost.

Therefore, development of method which can effectively solve the striation defect issue is desirable.

BRIEF SUMMARY OF THE INVENTION

One embodiment of the invention provides an image sensor structure comprising a substrate comprising a central area and a peripheral area; a sensing area comprising a plurality of pixels located at the central area of the substrate; a plurality of bond pads disposed at the peripheral area of the substrate; and a plurality of protrusions disposed between the bond pads and the sensing area and surrounding the sensing area, wherein a largest distance between any two points of the protrusion under a top view is getting smaller from the peripheral area to the central area.

The image sensor structure further comprises a scribe line surrounding the bond pads.

The protrusions comprise photoresist. The protrusions form a plurality of loops. A first largest distance between any two points of the protrusion of the loop adjacent to the bond pads is smaller than a length of one side towards the sensing area of the bond pad. The length of the one side towards the sensing area of the bond pad ranges from 40 μm to 300 μm. A second largest distance between any two points of the protrusion of the loop adjacent to the sensing area is smaller than a width of the pixel. The width of the pixel ranges from 0.9 μm to 60 μm.

The protrusions have a plane figure as a trapezium having a first side and a second side shorter than the first side under a top view. The first side of the trapezium faces one side towards the sensing area of the bond pad. A distance between centers of the two adjacent trapeziums of the same loop is shorter than the first side of the trapezium. A distance between centers of the two adjacent trapeziums of the same loop is longer than the second side of the trapezium.

The protrusions have a plane figure as a diamond having a diagonal under a top view. A distance between centers of the two adjacent diamonds of the same loop is shorter than a total length of one side towards the sensing area of the bond pad and the diagonal of the diamond. A distance between centers of the two adjacent diamonds of the same loop is longer than the diagonal of the diamond.

The protrusions have a plane figure as a circle having a diameter under a top view. A distance between centers of the two adjacent circles of the same loop is shorter than a total length of one side towards the sensing area of the bond pad and the diameter of the circle. A distance between centers of the two adjacent circles of the same loop is longer than the diameter of the circle.

In the present invention, the protrusions with various shapes (such as trapezium, diamond or circle) disposed between the bond pads and the sensing area is utilized to interfere with the striation formed from the photoresist coating process. Specifically, a largest distance between any two points of the protrusion under a top view is getting smaller from the peripheral area to the central area. For example, the dimension (a largest distance between any two points) of the protrusion adjacent to the bond pads is largest among the protrusions but smaller than (and close in dimension to) that of the bond pads; and the dimension (a largest distance between any two points) of the protrusion adjacent to the sensing area is smallest among the protrusions and smaller than the pixel size. Therefore, the striation is getting smaller from the peripheral area to the central area and is quite smaller than the pixel size due to the interference effect formed by the disposition of the protrusions, effectively improving display picture quality.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
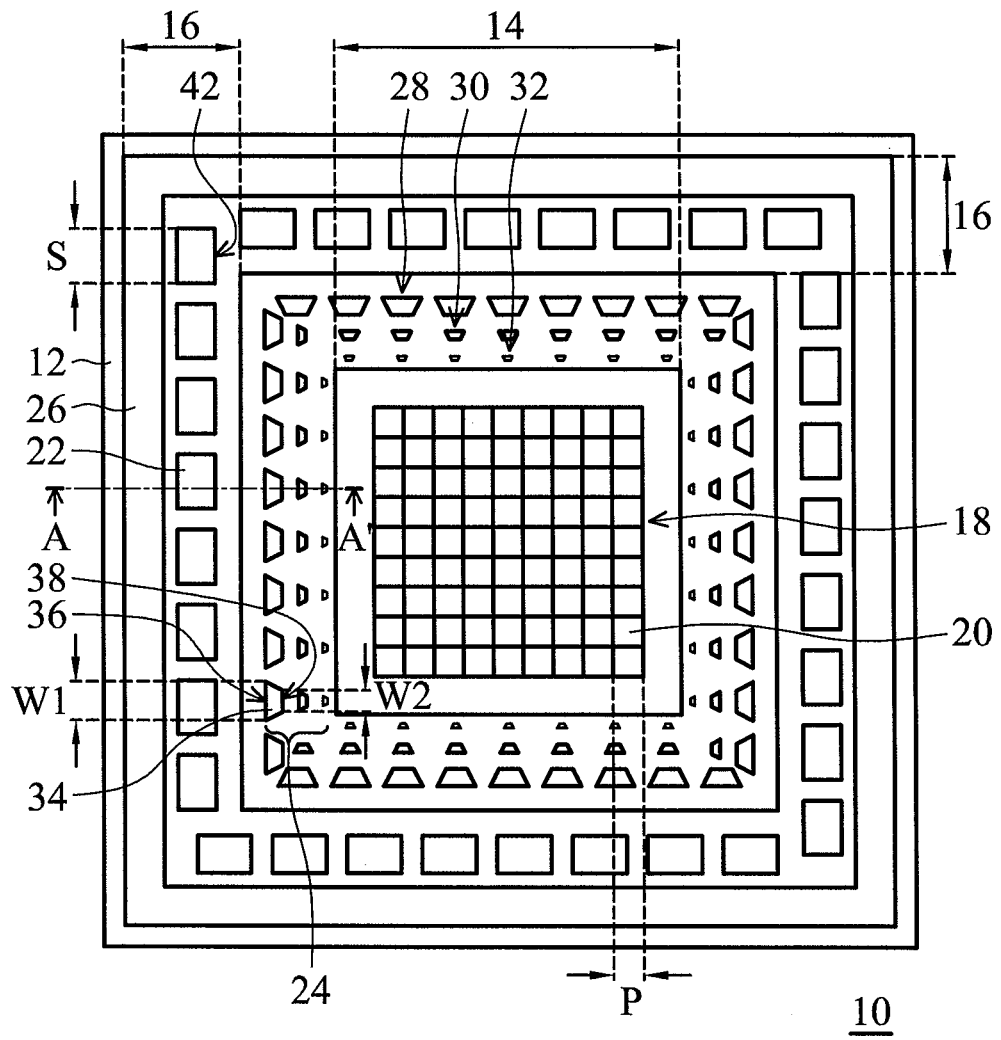
FIG. 1 is a top view illustrating an image sensor structure with trapezium-shaped protrusions according to one embodiment of the invention.

One embodiment of an image sensor structure according to the invention is described with reference to FIG. 1. FIG. 1 is a top view illustrating an image sensor structure with a plurality of (an array of) protrusions of trapezium.

Referring to FIG. 1, an image sensor structure 10 comprises a substrate 12 comprising a central area 14 and a peripheral area 16, a sensing area 18 comprising a plurality of pixels 20 located at the central area 14 of the substrate 12, a plurality of bond pads 22 disposed at the peripheral area 16 of the substrate 12, and a plurality of (an array 24 of) protrusions 34 disposed between the bond pads 22 and the sensing area 18 and surrounding the sensing area 18. Specifically, a largest distance between any two points of the protrusion 34 under the top view is getting smaller from the peripheral area 16 to the central area 14.

In this embodiment, the image sensor structure 10 further comprises a scribe line 26 surrounding the bond pads 22.

In one embodiment, the protrusions 34 comprise photoresist.

Figure 1A:
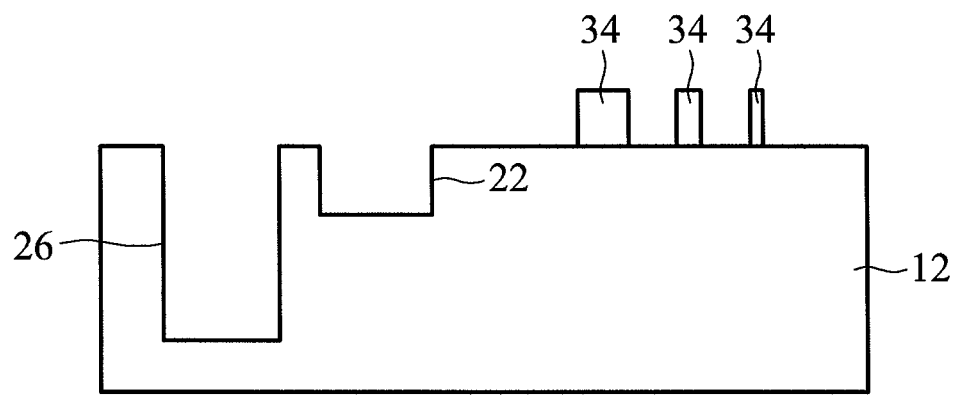
FIG. 1A is a cross-sectional view along A-A' line of FIG. 1 illustrating a profile of protrusions disposed between bond pads and sensing area according to one embodiment of the invention.

FIG. 1A is a cross-sectional view along A-A' line of FIG. 1 illustrating a profile of protrusions disposed between bond pads and sensing area. In this figure, the protrusions 34 are disposed adjacent to the bond pads 22. The scribe line 26 further surrounds the bond pads 22.

The protrusion 34 is a solid substance and its profile is illustrated in two-dimensional figures. In this embodiment, the protrusion 34 has a plane figure as a trapezium from a top view and has a cross section figure as a square or rectangular.

In this embodiment, referring to FIG. 1, the protrusions 34 form a plurality of loops (28, 30 and 32) surrounding the sensing area 18 disposed from an area adjacent to the bond pads 22 to an area adjacent to the sensing area 18. A largest distance between any two points of each protrusion 34 in the same loop is the same. Specifically, a largest distance between any two points of the protrusion 34 of the loop 28 adjacent to the bond pads 22 is larger than a largest distance between any two points of the protrusion 34 of other loops (30 and 32). Additionally, a largest distance between any two points of the protrusion 34 of the loop 32 adjacent to the sensing area 18 is smaller than a largest distance between any two points of the protrusion 34 of other loops (28 and 30).

In this embodiment, a largest distance between any two points of the protrusion 34 of the loop 28 adjacent to the bond pads 22 is smaller than a length S of one side 42 towards the sensing area 18 of the bond pad 22, for example, the length S of the one side 42 towards the sensing area 18 of the bond pad 22 ranging from 40 μm to 300 μm. A largest distance between any two points of the protrusion 34 (incapable of peeling) of the loop 32 adjacent to the sensing area 18 is smaller than a width P of the pixel 20, for example, the width P of the pixel 20 ranging from 0.9 μm to 60 μm.

Figure 2:
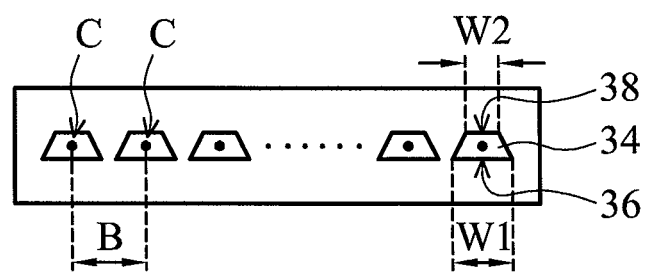
FIG. 2 is a top view illustrating a part of trapezium-shaped protrusions disposed between bond pads and sensing area according to one embodiment of the invention.

The arrangement and dimension of the protrusions 34 in FIG. 1 are illustrated in detail, in FIG. 2. FIG. 2 is a top view illustrating a part of protrusions of trapezium disposed between bond pads and sensing area according to one embodiment of the invention.

In this embodiment, referring to FIG. 2, the protrusions 34 have a plane figure as a trapezium having a first side 36 with a first width W1 and a second side 38 with a second width W2 which is shorter than the first width W1 of the first side 36 under the top view. Specifically, while the protrusions 34 have a plane figure as a trapezium, the first side 36 of the protrusions 34 faces the one side 42 towards the sensing area 18 of the bond pads 22, as shown in FIG. 1. Referring to FIG. 2, a distance B between centers C of the two adjacent trapezium-shaped protrusions 34 in the same loop is shorter than a total length (S+W1) of the length S of the one side 42 towards the sensing area 18 of the bond pad 22 and the first width W1 of the first side 36 of the trapezium-shaped protrusions 34, and the distance B between the centers C of the two adjacent trapezium-shaped protrusions 34 in the same loop is longer than the second width W2 of the second side 38 of the trapezium-shaped protrusions 34.

In this embodiment, "a largest distance between any two points" of the trapezium-shaped protrusion 34 represents the first width W1 of the first side 36 of the trapezium-shaped protrusion 34. Therefore, in this embodiment, the first width W1 of the first side 36 of the trapezium-shaped protrusion 34 of the loop 28 adjacent to the bond pads 22 is smaller than the length S of the one side 42 towards the sensing area 18 of the bond pad 22. Additionally, the first width W1 of the first side 36 of the trapezium-shaped protrusion 34 (incapable of peeling) of the loop 32 adjacent to the sensing area 18 is smaller than the width P of the pixel 20.

Figure 3:
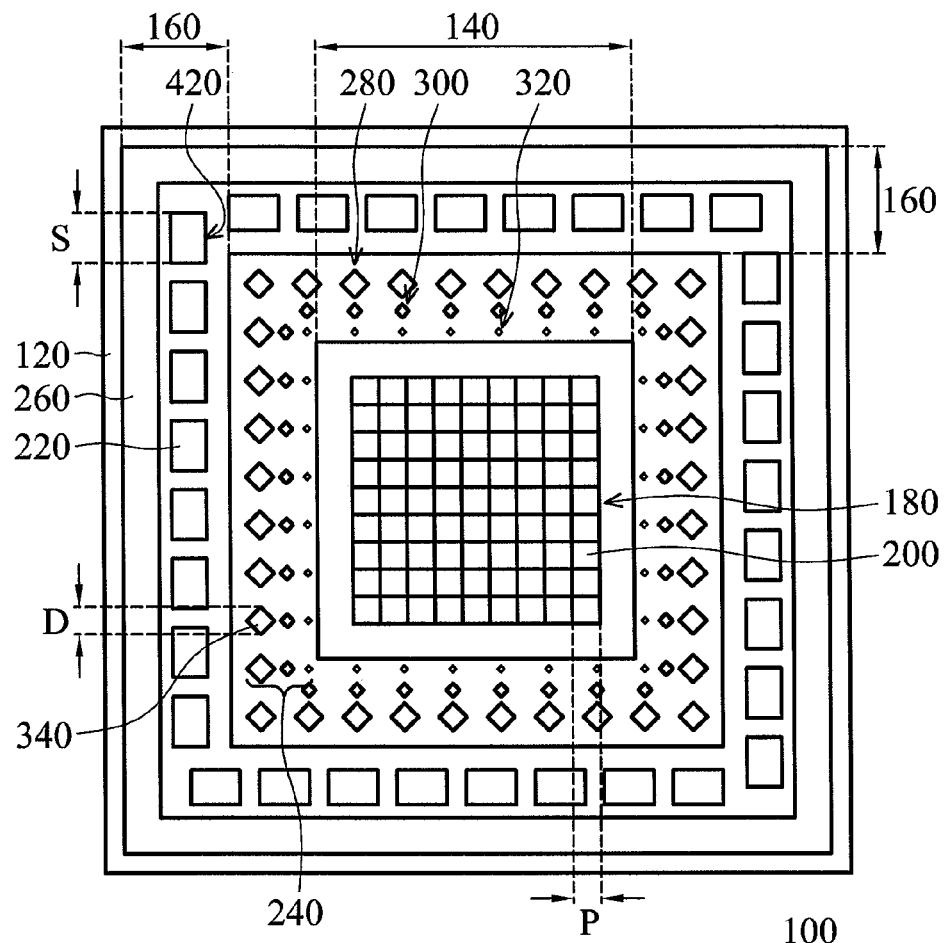
FIG. 3 is a top view illustrating an image sensor structure with diamond-shaped protrusions according to one embodiment of the invention.

One embodiment of an image sensor structure according to the invention is described with reference to FIG. 3. FIG. 3 is a top view illustrating an image sensor structure with a plurality of (an array of) protrusions of diamond.

Referring to FIG. 3, an image sensor structure 100 comprises a substrate 120 comprising a central area 140 and a peripheral area 160, a sensing area 180 comprising a plurality of pixels 200 located at the central area 140 of the substrate 120, a plurality of bond pads 220 disposed at the peripheral area 160 of the substrate 120, and a plurality of (an array 240 of) protrusions 340 disposed between the bond pads 220 and the sensing area 180 and surrounding the sensing area 180. Specifically, a largest distance between any two points of the protrusion 340 under the top view is getting smaller from the peripheral area 160 to the central area 140.

In this embodiment, the image sensor structure 100 further comprises a scribe line 260 surrounding the bond pads 220.

In one embodiment, the protrusions 340 comprise photoresist.

The protrusion 340 is a solid substance and its profile is illustrated in two-dimensional figures. In this embodiment, the protrusion 340 has a plane figure as a diamond from a top view and has a cross section figure as a square or rectangular.

In this embodiment, the protrusions 340 form a plurality of loops (280, 300 and 320) surrounding the sensing area 180 disposed from an area adjacent to the bond pads 220 to an area adjacent to the sensing area 180. A largest distance between any two points of each protrusion 340 in the same loop is the same. Specifically, a largest distance between any two points of the protrusion 340 of the loop 280 adjacent to the bond pads 220 is larger than a largest distance between any two points of the protrusion 340 of other loops (300 and 320). Additionally, a largest distance between any two points of the protrusion 340 of the loop 320 adjacent to the sensing area 180 is smaller than a largest distance between any two points of the protrusion 340 of other loops (280 and 300).

In this embodiment, a largest distance between any two points of the protrusion 340 of the loop 280 adjacent to the bond pads 220 is smaller than a length S of one side 420 towards the sensing area 180 of the bond pad 220, for example, the length S of the one side 420 towards the sensing area 180 of the bond pad 220 ranging from 40 μm to 300 μm. A largest distance between any two points of the protrusion 340 (incapable of peeling) of the loop 320 adjacent to the sensing area 180 is smaller than a width P of the pixel 200, for example, the width P of the pixel 200 ranging from 0.9 μm to 60 μm.

Figure 4:
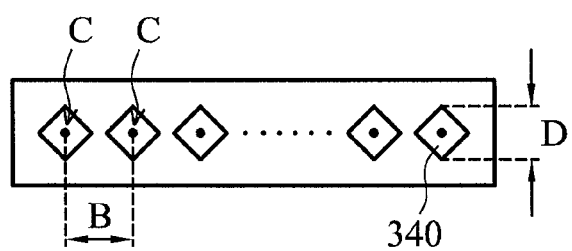
FIG. 4 is a top view illustrating a part of diamond-shaped protrusions disposed between bond pads and sensing area according to one embodiment of the invention.

The arrangement and dimension of the protrusions 340 in FIG. 3 are illustrated in detail, in FIG. 4. FIG. 4 is a top view illustrating a part of protrusions of diamond disposed between bond pads and sensing area according to one embodiment of the invention.

In this embodiment, referring to FIGS. 3 and 4, the protrusions 340 have a plane figure as a diamond having a diagonal D under the top view. Specifically, a distance B between centers C of the two adjacent diamond-shaped protrusions 340 in the same loop is shorter than a total length (S+D) of the length S of the one side 420 towards the sensing area 180 of the bond pad 220 and the diagonal D of the diamond-shaped protrusions 340, and the distance B between the centers C of the two adjacent diamond-shaped protrusions 340 in the same loop is longer than the diagonal D of the diamond-shaped protrusions 340.

In this embodiment, "a largest distance between any two points" of the diamond-shaped protrusion 340 represents the diagonal D of the diamond-shaped protrusion 340. Therefore, in this embodiment, the diagonal D of the diamond-shaped protrusion 340 of the loop 280 adjacent to the bond pads 220 is smaller than the length S of the one side 420 towards the sensing area 180 of the bond pad 220. Additionally, the diagonal D of the diamond-shaped protrusion 340 (incapable of peeling) of the loop 320 adjacent to the sensing area 180 is smaller than the width P of the pixel 200.

Figure 5:
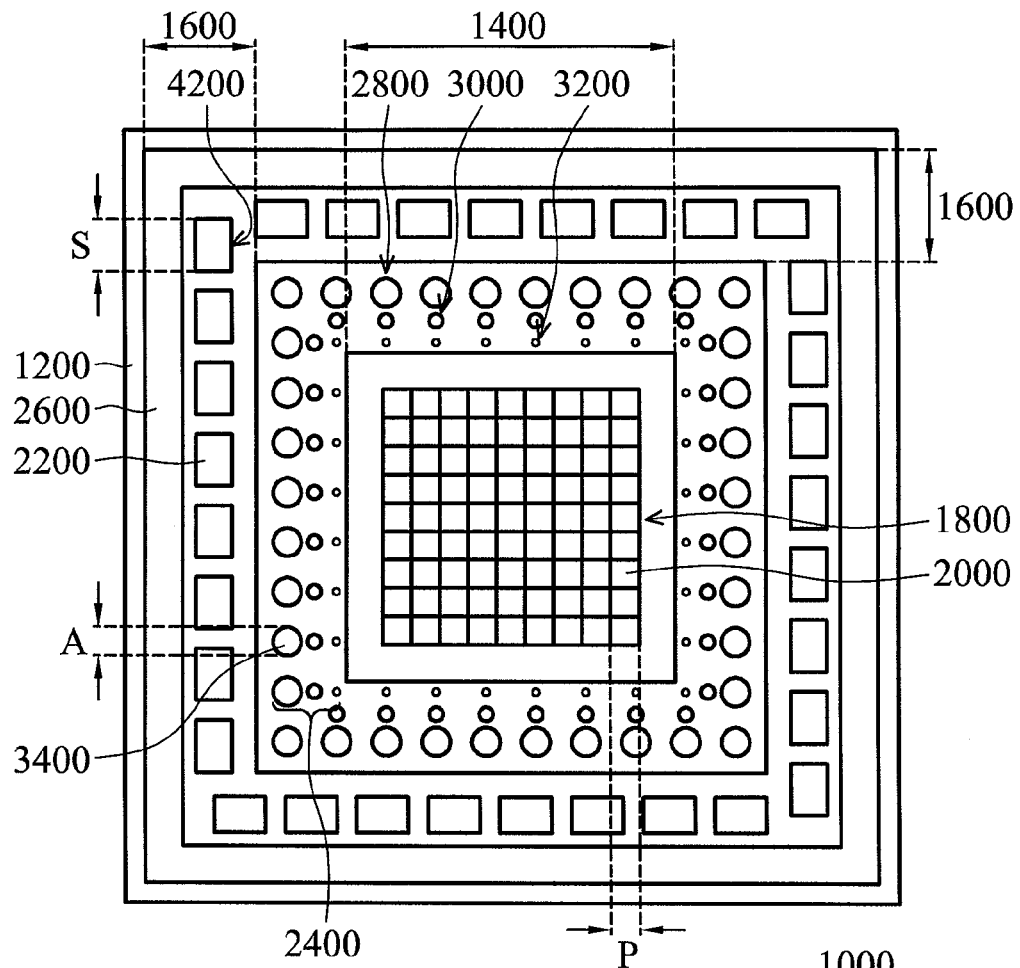
FIG. 5 is a top view illustrating an image sensor structure with circle-shaped protrusions according to one embodiment of the invention.

One embodiment of an image sensor structure according to the invention is described with reference to FIG. 5. FIG. 5 is a top view illustrating an image sensor structure with a plurality of (an array of) protrusions of circle.

Referring to FIG. 5, an image sensor structure 1000 comprises a substrate 1200 comprising a central area 1400 and a peripheral area 1600, a sensing area 1800 comprising a plurality of pixels 2000 located at the central area 1400 of the substrate 1200, a plurality of bond pads 2200 disposed at the peripheral area 1600 of the substrate 1200, and a plurality of (an array 2400 of) protrusions 3400 disposed between the bond pads 2200 and the sensing area 1800 and surrounding the sensing area 1800. Specifically, a largest distance between any two points of the protrusion 3400 under the top view is getting smaller from the peripheral area 1600 to the central area 1400.

In this embodiment, the image sensor structure 1000 further comprises a scribe line 2600 surrounding the bond pads 2200.

In one embodiment, the protrusions 3400 comprise photoresist.

The protrusion 3400 is a solid substance and its profile is illustrated in two-dimensional figures. In this embodiment, the protrusion 3400 has a plane figure as a circle from a top view and has a cross section figure as a square or rectangular.

In this embodiment, the protrusions 3400 form a plurality of loops (2800, 3000 and 3200) surrounding the sensing area 1800 disposed from an area adjacent to the bond pads 2200 to an area adjacent to the sensing area 1800. A largest distance between any two points of each protrusion 3400 in the same loop is the same. Specifically, a largest distance between any two points of the protrusion 3400 of the loop 2800 adjacent to the bond pads 2200 is larger than a largest distance between any two points of the protrusion 3400 of other loops (3000 and 3200). Additionally, a largest distance between any two points of the protrusion 3400 of the loop 3200 adjacent to the sensing area 1800 is smaller than a largest distance between any two points of the protrusion 3400 of other loops (2800 and 3000).

In this embodiment, a largest distance between any two points of the protrusion 3400 of the loop 2800 adjacent to the bond pads 2200 is smaller than a length S of one side 4200 towards the sensing area 1800 of the bond pad 2200, for example, the length S of the one side 4200 towards the sensing area 1800 of the bond pad 2200 ranging from 40 μm to 300 μm. A largest distance between any two points of the protrusion 3400 (incapable of peeling) of the loop 3200 adjacent to the sensing area 1800 is smaller than a width P of the pixel 2000, for example, the width P of the pixel 2000 ranging from 0.9 μm to 60 μm.

Figure 6:
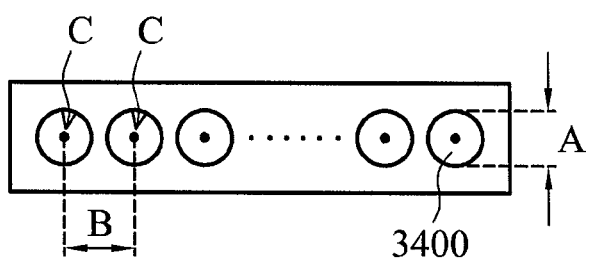
FIG. 6 is a top view illustrating a part of circle-shaped protrusions disposed between bond pads and sensing area according to one embodiment of the invention.

The arrangement and dimension of the protrusions 3400 in FIG. 5 are illustrated in detail, in FIG. 6. FIG. 6 is a top view illustrating a part of protrusions of circle disposed between bond pads and sensing area according to one embodiment of the invention.

In this embodiment, referring to FIGS. 5 and 6, the protrusions 3400 have a plane figure as a circle having a diameter A under the top view. Specifically, a distance B between centers C of the two adjacent circle-shaped protrusions 3400 in the same loop is shorter than a total length (S+A) of the length S of the one side 4200 towards the sensing area 1800 of the bond pad 2200 and the diameter A of the circle-shaped protrusions 3400, and the distance B between the centers C of the two adjacent circle-shaped protrusions 3400 in the same loop is longer than the diameter A of the circle-shaped protrusions 3400.

In this embodiment, "a largest distance between any two points" of the circle-shaped protrusion 3400 represents the diameter A of the circle-shaped protrusion 3400. Therefore, in this embodiment, the diameter A of the circle-shaped protrusion 3400 of the loop 2800 adjacent to the bond pads 2200 is smaller than the length S of the one side 4200 towards the sensing area 1800 of the bond pad 2200. Additionally, the diameter A of the circle-shaped protrusion 3400 (incapable of peeling) of the loop 3200 adjacent to the sensing area 1800 is smaller than the width P of the pixel 2000.

In the present invention, the protrusions with various shapes (such as trapezium, diamond or circle) disposed between the bond pads and the sensing area are utilized to interfere with the striation formed from the photoresist coating process. Specifically, a largest distance between any two points of the protrusion under a top view is getting smaller from the peripheral area to the central area. For example, the dimension (a largest distance between any two points) of the protrusion adjacent to the bond pads is largest among the protrusions but smaller than (and close in dimension to) that of the bond pads; and the dimension (a largest distance between any two points) of the protrusion adjacent to the sensing area is smallest among the protrusions and smaller than the pixel size. Therefore, the striation is getting smaller from the peripheral area to the central area and is quite smaller than the pixel size due to the interference effect formed by the disposition of the protrusions, effectively improving display picture quality.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An image sensor structure, comprising:
   a substrate comprising a central area and a peripheral area;
   a sensing area comprising a plurality of pixels located at the central area of the substrate;
   a plurality of bond pads disposed at the peripheral area of the substrate; and
   a plurality of protrusions disposed between the bond pads and the sensing area and surrounding the sensing area, wherein each protrusion has one largest distance between any two points thereof under a plan view, and such largest distances are getting smaller from the peripheral area to the central area.

2. The image sensor structure as claimed in claim 1, further comprising a scribe line surrounding the bond pads.

3. The image sensor structure as claimed in claim 1, wherein the protrusions comprise photoresist.

4. The image sensor structure as claimed in claim 1, wherein the protrusions form a plurality of loops.

5. The image sensor structure as claimed in claim 4, wherein a first largest distance between any two points of the protrusion of the loop adjacent to the bond pads is smaller than a length of one side towards the sensing area of the bond pad.

6. The image sensor structure as claimed in claim 5, wherein the length of the one side towards the sensing area of the bond pad ranges from 40 μm to 300 μm.

7. The image sensor structure as claimed in claim 4, wherein a second largest distance between any two points of the protrusion of the loop adjacent to the sensing area is smaller than a width of the pixel.

8. The image sensor structure as claimed in claim 7, wherein the width of the pixel ranges from 0.9 μm to 60 μm.

9. The image sensor structure as claimed in claim 4, wherein the protrusions have a plane figure as a trapezium having a first side and a second side shorter than the first side under a plan view, the first side being parallel with the second side.

10. The image sensor structure as claimed in claim 9, wherein the first side of the trapezium faces one side towards the sensing area of the bond pad.

11. The image sensor structure as claimed in claim 9, wherein a distance between centers of the two adjacent trapeziums of the same loop is greater than the first side of the trapezium.

12. The image sensor structure as claimed in claim 9, wherein a distance between centers of the two adjacent trapeziums of the same loop is longer than the second side of the trapezium.

13. The image sensor structure as claimed in claim 4, wherein the protrusions have a plane figure as a diamond having a diagonal under a plan view.

14. The image sensor structure as claimed in claim 13, wherein a distance between centers of the two adjacent diamonds of the same loop is shorter than a total length of one side towards the sensing area of the bond pad and the diagonal of the diamond.

15. The image sensor structure as claimed in claim 13, wherein a distance between centers of the two adjacent diamonds of the same loop is longer than the diagonal of the diamond.

16. The image sensor structure as claimed in claim 4, wherein the protrusions have a plane figure as a circle having a diameter under a plan view.

17. The image sensor structure as claimed in claim 16, wherein a distance between centers of the two adjacent circles of the same loop is shorter than a total length of one side towards the sensing area of the bond pad and the diameter of the circle.

18. The image sensor structure as claimed in claim 16, wherein a distance between centers of the two adjacent circles of the same loop is longer than the diameter of the circle.

* * * * *